(12) United States Patent
Septon

(10) Patent No.: US 7,821,254 B2
(45) Date of Patent: Oct. 26, 2010

(54) METHOD AND APPARATUS FOR IMPROVING LOAD TIME FOR AUTOMATED TEST EQUIPMENT

(75) Inventor: Daven Septon, Loveland, CO (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 43 days.

(21) Appl. No.: 11/639,769

(22) Filed: Dec. 15, 2006

(65) Prior Publication Data

US 2008/0143360 A1 Jun. 19, 2008

(51) Int. Cl.
*G01R 31/28* (2006.01)

(52) U.S. Cl. .................................... 324/158.1

(58) Field of Classification Search ............... 324/158.1, 324/754–765
See application file for complete search history.

(56) References Cited

U.S. PATENT DOCUMENTS

| | | | | |
|---|---|---|---|---|
| 4,517,512 A | * | 5/1985 | Petrich et al. ............... | 714/724 |
| 5,471,148 A | * | 11/1995 | Sinsheimer et al. ......... | 324/754 |
| 5,528,158 A | * | 6/1996 | Sinsheimer et al. ......... | 324/758 |
| 6,107,813 A | * | 8/2000 | Sinsheimer et al. ......... | 324/758 |
| 6,127,834 A | * | 10/2000 | Eliashberg et al. .......... | 324/760 |
| 6,294,908 B1 | * | 9/2001 | Belmore et al. .......... | 324/158.1 |
| 6,462,532 B1 | * | 10/2002 | Smith ..................... | 324/158.1 |
| 6,476,628 B1 | * | 11/2002 | LeColst .................... | 324/765 |
| 6,509,754 B2 | * | 1/2003 | Lin et al. .................... | 324/755 |
| 6,975,130 B2 | * | 12/2005 | Yevmenenko ............... | 324/765 |
| 7,132,841 B1 | * | 11/2006 | Bertin et al. ................ | 324/765 |
| 7,262,616 B2 | * | 8/2007 | Brueckner et al. .......... | 324/755 |
| 7,642,105 B2 | * | 1/2010 | Co et al. ....................... | 438/17 |
| 2005/0261856 A1 | * | 11/2005 | Kushnick et al. ............ | 702/117 |

* cited by examiner

*Primary Examiner*—Ha Tran T Nguyen
*Assistant Examiner*—Joshua Benitez
(74) *Attorney, Agent, or Firm*—Holland & Hart, LLP

(57) ABSTRACT

An SOC tester having test cards with memory cards is presented. The SOC tester may be running a test on a device under test using test programs stored on one set of memory cards. Test programs may be down loaded to a second set of memory cards during testing using test programs from the first set of memory cards or during off times.

4 Claims, 4 Drawing Sheets

100

METHOD AND APPARATUS FOR IMPROVING LOAD TIME FOR AUTOMATED TEST EQUIPMENT

BACKGROUND

To ensure proper functionality and reliability, integrated circuits (ICs) are generally tested before shipping or placing the ICs in final products. Integrated circuits are commonly tested on automated test equipment (ATE), such as the Verigy 93000 SOC Tester.

FIG. 1 shows a typical SOC Tester 100, comprising a test head 110; a device under test (DUT) interface 120; a manipulator 130; a DUT board 150; a support rack 140; cables and hoses 160 between test head 110 and support rack 140; user interface 170 connected to support rack 140 with interconnect 144; optional off rack test program storage 180 connected to user interface 170 and support rack 140 with interconnect 142. There may also be a cooling unit (not shown) connected to the test head 110 for cooling hardware internal to the test head 110, probers (not shown) and handlers (not shown).

DUT interface 120 provides docking capabilities to handlers and wafer probers (not shown). The docking mechanism may be controlled by compressed air or mechanically, but if required may also be operated manually. Test head 110 is usually a water-cooled system and receives its cooling water supply from support rack 140 via hoses and cables 160, which in turn is connected by two flexible hoses to the cooling unit (not shown).

Support rack 140 houses a system controller (not shown), which is typically a Linux controller. Support rack 140 is attached to the manipulator 130 and serves as the interface between test head 110 and any of the following: an AC power source; water cooling source; compressed air source; the user interface; the off rack test program storage and other system management means. Tester 100 may also comprise additional support racks such as analog support racks for installing additional analog instruments. Manipulator 130 supports and positions test head 110 and provides 6 degrees of freedom for precise and repeatable connections between test head 100 and handlers or wafer probers (not shown).

Test head 110 comprises tester electronics and additional analog modules. With current technology, test head 110 may be configured with 512 pins or 1024 pins, but this will likely increase in the future. A 512 pin test head comprises 4 card cages (not shown) while a 1024 pin test head comprises 8 card cages (not shown). Each card cage may contain 8 test cards, respectively. A single test card supports 16 pins, making 128 pins per cage. Thus, a 4 cage test head contain 512 pins and an 8 cage test head 1024 pins. During testing, a DUT is mounted on a contactor (not shown) on the DUT board 150, which is connected to I/O channels by DUT interface 120. DUT interface 120 may comprise high performance coax cabling and spring contact pins or pogo pins, which establish electrical connection with DUT board 120.

FIGS. 2 and 3 show a test card 200 that may be housed within one of the 4 or 8 card cages 310, 312, 314, 316 of test head 110. Referring now specifically to FIG. 2, test card 200 may contain memory 210, a test processor 220, electronics 230, signal routing 240, pin routing 250, among other necessary circuitry and components. As will be appreciated by those skilled in the art, various test cards 200 are mounted in card cages 310, 312, 314, 316 of test head 110. Test cards 200 support testing of devices under test by generating waveforms or electrical signals that provide input to a device. The test card can also receive signals and measurement data to determine whether the device passed or failed.

During testing, an end user may interface with the tester 100 via the user interface 170. The end user may instruct the tester 100 to load a test program and run a test. The tester 100 can not run a test until the test program has been loaded. A test program may contain information about the device under test, including pins and specifications by which to test the device. A test program is generally saved to disk, but may be saved in disk memory on rack 140 or off rack 180 in a test program storage unit, CD, tape or on a network.

This process generally involves reading the test program from the disk memory or other memory storage location, transferring the test program to the tester by wire (e.g., optical, network or other known link) and loading the test program into the appropriate memory locations in the hardware, which are typically the memory 210 on each test card 200 in each card cage 310, 312, 314, 316 in the test head 110, in order to provide test program instructions to each test processor for the pins controlled by each test card.

This process can take upwards of several hours, depending on the size of the test programs and associated data being down loaded. Current times for large test program files is 2-4 hours, but one can imagine that this will only increase with more complex and densely populated devices to test and more complex test programs and as the pin density of test cards is increased.

Thus, it will be appreciated that test program down load times will only increase using current test program downloading techniques. It will also be appreciated by those skilled in the art, that overall test time, which currently includes test program load time, is costly and a critical parameter that IC manufacturers are generally trying to decrease. The load time associated with loading a test program to tester hardware resources is especially critical if the operating system or the test software crash, as the test programs would have to be reloaded into the hardware resources on the tester. It would be advantageous if an SOC tester were able to load test programs to hardware resources on the tester more efficiently than current techniques permit.

BRIEF DESCRIPTION OF THE DRAWINGS

An understanding of the present teachings can be gained from the following detailed description, taken in conjunction with the accompanying drawings of which like reference numerals in different drawings refer to the same or similar elements.

DETAILED DESCRIPTION

In the following detailed description, for purposes of explanation and not limitation, example embodiments disclosing specific details are set forth in order to provide an understanding of embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatus and methods may be omitted so as to not obscure the description of the example embodiments. Such methods and apparatus are clearly within the scope of the present teachings.

Figure 1:
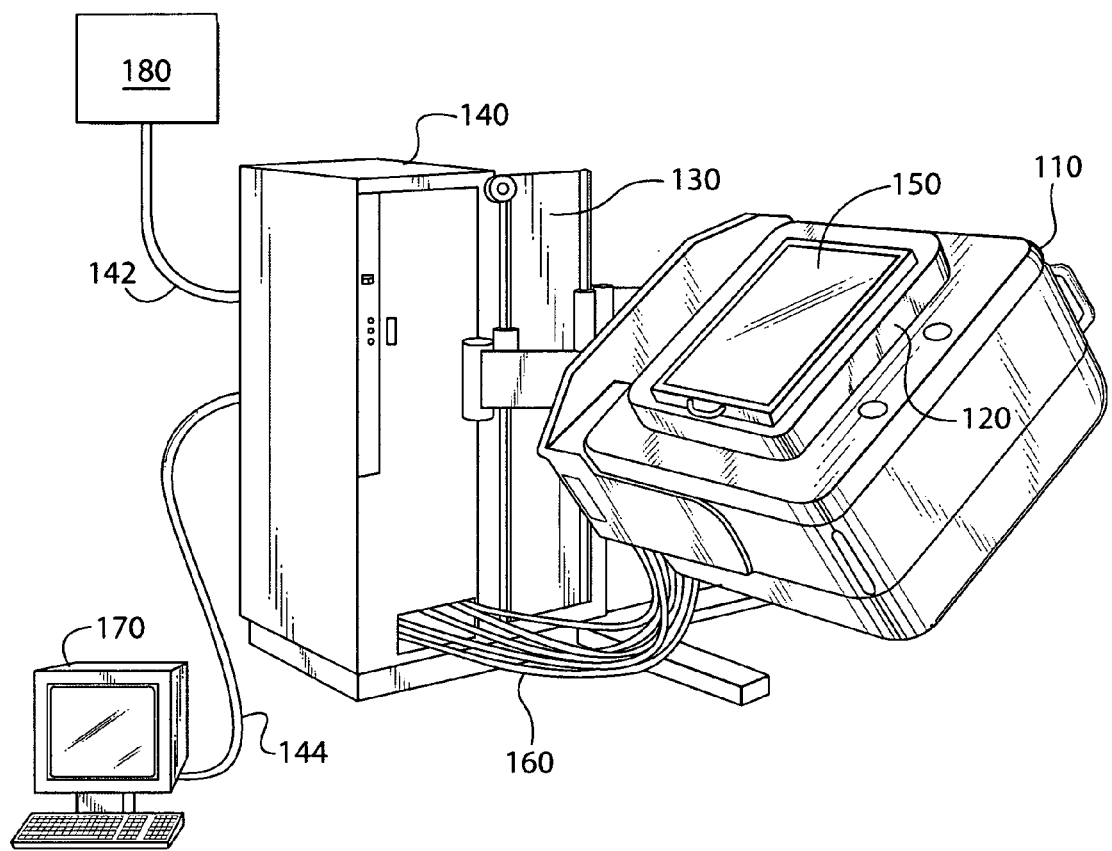
FIG. 1 illustrates a diagram of major components of a typical SOC tester system.
Figure 2:
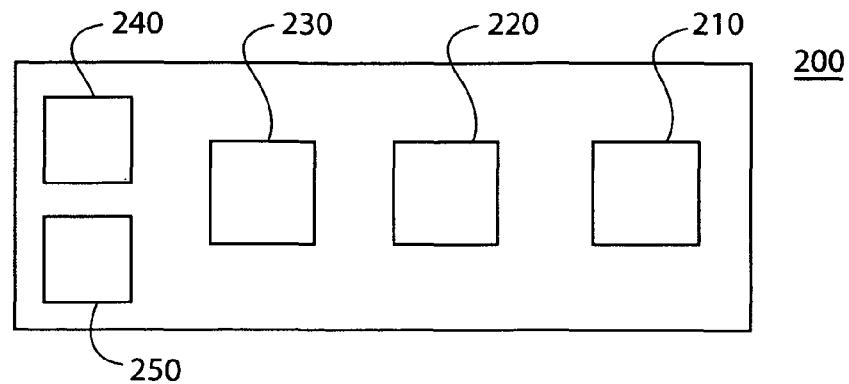
FIG. 2 illustrates a representative diagram of a typical SOC test card with exemplary components.
Figure 3:
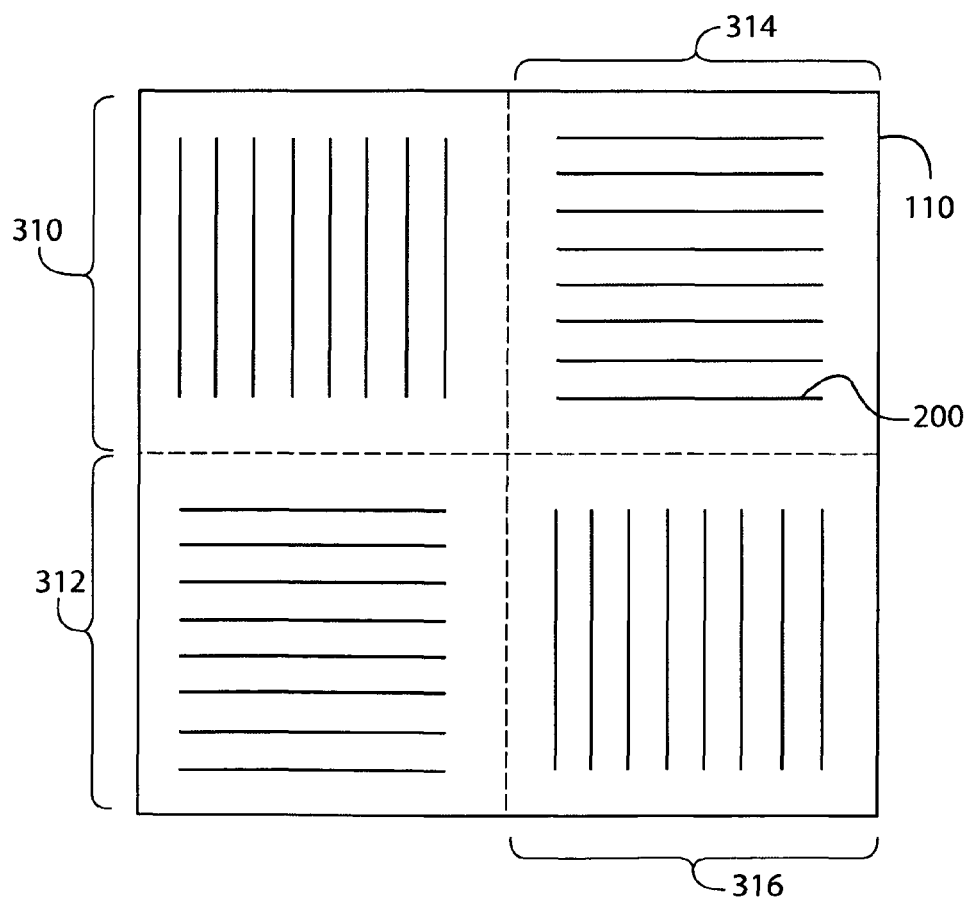
FIG. 3 illustrates a representative diagram of card cages inside an exemplary SOC test head.
Figure 4:
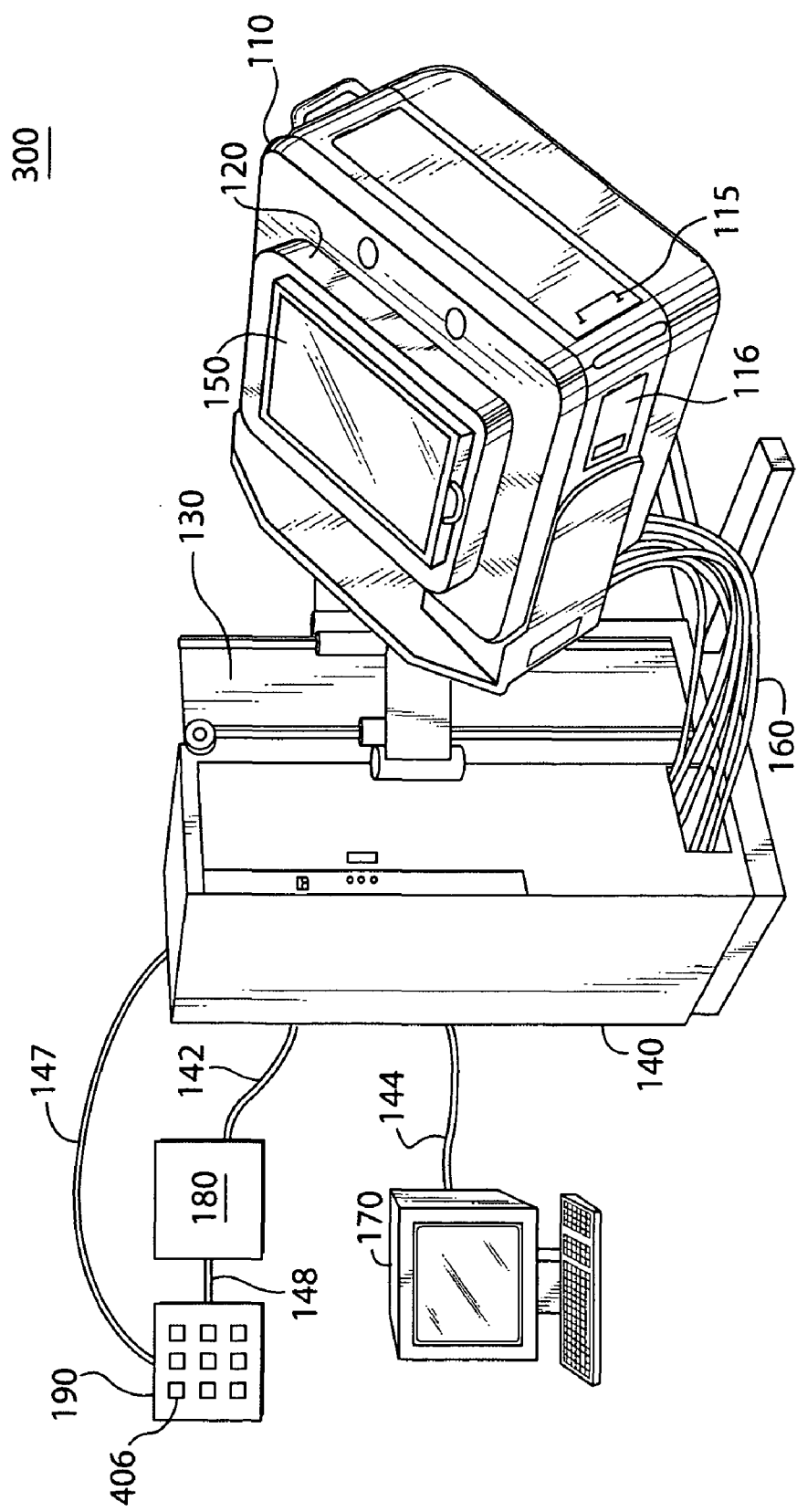
FIG. 4 illustrates a diagram of major components of an SOC tester system in accordance with the present teachings.

Referring now specifically to FIG. 4, a diagram of an SOC test system 300 according to the present teachings is shown. Test system 300 comprises a test head 110; a device under test (DUT) interface 120; a manipulator 130; a DUT board 150; a support rack 140; cables and hoses 160 between test head 110 and support rack 140; user interface 170 connected to support rack 140 with interconnect 144; off rack test program storage 180 connected to support rack 140 with interconnect 142.

Figure 5:
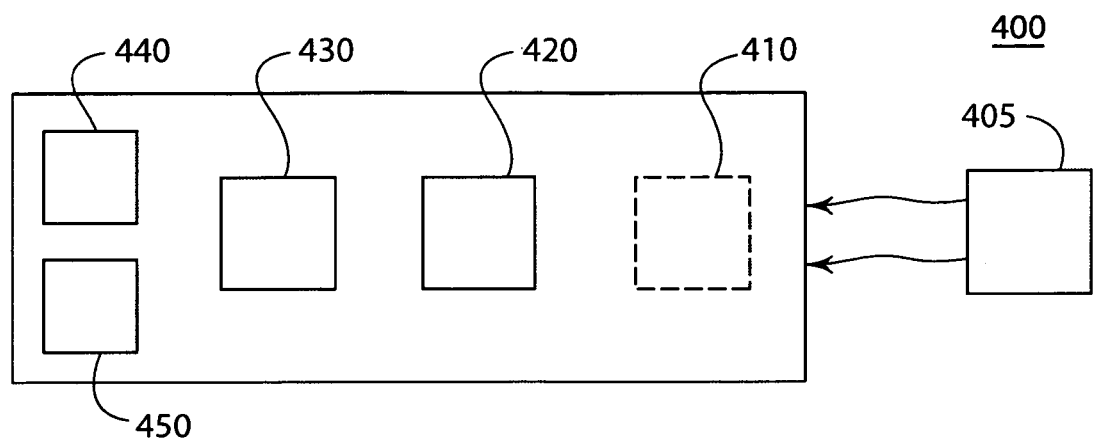
FIG. 5 illustrates a representative diagram of an SOC test card in accordance with the present teachings.

Test system 300 further comprises one or more doors or other means 115, 116 for accessing test cards 400 (shown in FIGS. 5-7) in card cages 310, 312, 314, 316 of the test head 110. As shown in FIG. 5, test cards 400 may comprise a plug-in, slot, or other means 410 for accepting a removable memory card 405. Removable memory card 405 may be any known removable memory means, such as a memory stick, EEPROMS, programmable chips, flash memory, or memory card, (hereinafter memory card 405 or 406) that could be changed by the operator whenever a new test program should be loaded.

During operation, the operator may load memory cards 405 on each test card 400 prior to running a test, rather than down loading test programs from a storage unit, CD, tape, internet or networked storage location. This process should save considerable time over the down loading procedure of the prior art. Some memory cards may have test programs already loaded thereon.

SOC test system 300 may also comprise a separate memory card rack 190 for storing memory cards 406. The memory card rack 190 may be connected to the support rack 140 via a connection 147; and to the off rack storage unit 180 via connection 148. Connections 142 through 148 may be high speed links, such as wire, optical, network, LAN or any known communication link. Memory card rack 190 may also be part of the system rack 140.

During operation, the operator may manually load memory cards 405 onto memory card slots 410 on test cards 400 in card cages 310, 312, 314, 316 of the test head 110 and run a test. The operator may have the controller load test programs onto a separate set of memory cards 406 loaded in the memory card rack 190. The down loading of test programs to memory cards 406 may occur simultaneously while the tester 300 runs one or more test on devices under test or during system down times. Then, when the test programs on memory cards 405 are no longer needed, and test programs on memory cards 406 are needed, memory cards 405 may be removed from the memory card slot 410 on the test cards 400 and replaced with memory cards 406. Then memory cards 405 may be put into the memory card rack 190 and down loaded with new test programs, while one or more tests are run on one or more devices under test using test programs on memory cards 406 on the test cards 400. Additionally, the memory cards can be connected to a completely separate controller—offline from the tester—to load test programs.

Figure 6:
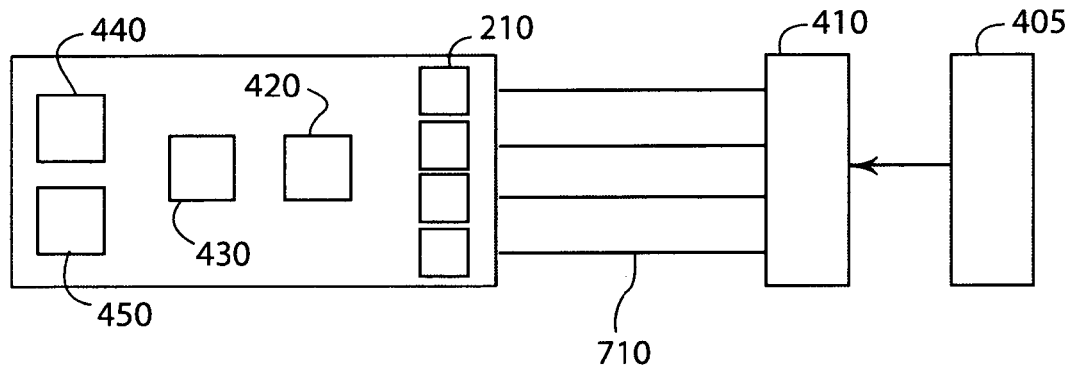
FIG. 6 illustrates a representative diagram of an SOC test card in accordance with a second embodiment of the present teachings.

Referring now specifically to FIG. 6, a second embodiment of the present teachings in which a test card 400 has memory locations 210 that are connected to a memory card slot 410 that is not located on the test card 400. Memory card slot 410 may be part of the test head or internal to the test head 110 and connected to the card cage and test card 410 via wiring, high speed interconnect, or similar connection means.

Figure 7:
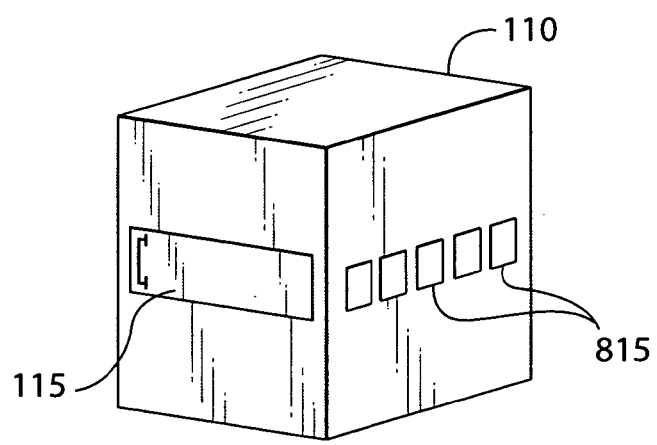
FIG. 7 illustrates a perspective view of a test head in accordance with a third embodiment of the present teachings.

Referring now specifically to FIG. 7, a perspective view of a test head 110 is presented in accordance with a third embodiment of the present teachings, in which test head 110 may have access slots 815 by which memory cards 405 may be inserted into and removed from memory slots 410 without having to open the test head 110. It will be appreciated that access does not need to be given to the test cards 400, as memory cards 405 may be plugged into access slots 815 or 410 on the perimeter of the test head 110.

This method still requires that a test program is down loaded to the memory card 210 on the test card 400 over connections 710, as shown in FIG. 6. However, by using memory card 405 for each test card 400, the down load of the test programs to the test card memory 210 in the card cages could be done in parallel, which would still save considerable down loading time over the techniques of the prior art. It will be appreciated that plugging memory cards 405 directly into the test cards 400 will give greater time savings. The end system design will involve trade offs between down load time savings desired, system costs, access to expensive test cards in card cages, and overall test head design and costs.

Memory cards 405 and 406 that plug into test cards 400 may be expensive high speed memory or less expensive memory. Test programs may be stored on less expensive memory cards 405 and 406 and inserted into test head 110 and transferred to high speed memory 210 in parallel.

As will be readily appreciated by those skilled in the art, the present teachings will significantly reduce down time of the tester and overall test time, by reducing the down load time for test programs which typically takes 2-4 hours, but can take significantly longer.

Embodiments of the teachings are described herein by way of example with reference to the accompanying drawings describing an SOC test system according to the present teachings. Other variations, adaptations, and embodiments of the present teachings will occur to those of ordinary skill in the art given benefit of the present teachings. For example, for tests that have shorter down load times, these may be down loaded directly to the memory cards 405, 406 on the test cards 400 and run.

Furthermore, there may be one or more memory card slots 410 on the test card 400, and tests may be selected by the controller or the operator directing the system to use the test program on one or the other of the memory cards 405, 406 on the test cards 400. Moreover, there may be more than one memory card permanently located on the test cards, such that the system is down loading a test program to one memory card 405, while the tester is running a test on a DUT using the memory stored on the other memory card 406. Tests may be down loaded to one or more cards 405 during off times or during tests that are using one or more cards 406. Also, the system does not need to replace cards, if enough cards are employed in the hardware of the system to permit use of one or more during testing, while one or more memory cards 406 are being written.

The invention claimed is:

1. An apparatus comprising:
    a controller;
    a test head connected to the controller;
    one or more card cages in the test head;
    one or more test cards housed within the one or more card cages in the test head;
    one or more memory card slots on the one or more test cards; and a plurality of memory cards, wherein the test head is configured so the one or more test cards in the one or more card cages is accessible by an operator; wherein the one or more memory card slots on the one or more test cards is configured so the one or more memory cards is removable by an operator; wherein the one or more test cards are configured to run a first one or more test programs loaded on a first set of the memory cards, and then run a second one or more test programs loaded on a second set of the memory cards.

2. An apparatus in accordance with claim 1, further comprising a memory card rack via which the second one or more test programs are down loaded to the second set of memory cards while the first one or more test programs are being run on the one or more test cards.

3. An apparatus in accordance with claim 2, wherein the controller is configured to down load the second one or more test programs to the second set of memory cards via the memory rack while the first one or more test programs are being run on the one or more test cards.

4. An apparatus in accordance with claim 1, wherein the test head comprises one or more doors for accessing the one or more test cards.

* * * * *